US009373949B2

(12) United States Patent
Chu et al.

(10) Patent No.: US 9,373,949 B2
(45) Date of Patent: Jun. 21, 2016

(54) PROTECTION CASE FOR ELECTRONIC DEVICE

(71) Applicant: HON HAI PRECISION INDUSTRY CO., LTD., New Taipei (TW)

(72) Inventors: Chen-Ching Chu, New Taipei (TW); Cheng-Kuo Lee, New Taipei (TW); Yu-Ning Wang, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 14/485,100

(22) Filed: Sep. 12, 2014

(65) Prior Publication Data

US 2015/0092366 A1  Apr. 2, 2015

(30) Foreign Application Priority Data

Sep. 30, 2013 (TW) ............... 102218252 U

(51) Int. Cl.
*H05K 5/02* (2006.01)
*H02G 11/02* (2006.01)
*H05K 5/00* (2006.01)
*H04R 1/10* (2006.01)
*A45C 11/00* (2006.01)

(52) U.S. Cl.
CPC ............. *H02G 11/02* (2013.01); *H04R 1/1033* (2013.01); *H05K 5/0052* (2013.01); *A45C 2011/002* (2013.01)

(58) Field of Classification Search
CPC ... G06F 1/1656; G06F 1/1616; G06F 1/1628; G06F 1/1647; G06F 1/1658; G06F 1/1681; G06F 1/1686; G06F 3/167; G06F 19/3406; H05K 5/0217; H05K 5/0086; H05K 5/0017; H05K 5/0052; H05K 5/02; H05K 5/0221; H05K 5/0243; H04R 1/1033; A45C 2011/00; H02G 11/02
USPC ............. 361/679.01, 679.02, 679.26, 679.27, 361/679.21, 679.55–679.58, 752; 455/575.1–575.4; 312/223.1–223.2; 242/405

See application file for complete search history.

(56) References Cited

U.S. PATENT DOCUMENTS

2003/0095658 A1    5/2003  Liao
2009/0262490 A1*  10/2009  Huang ................. H04R 1/1033
                                                         361/679.02
2013/0083456 A1    4/2013  Koenig
2014/0048443 A1    2/2014  Steinmueller et al.
2014/0110206 A1    4/2014  Wang

FOREIGN PATENT DOCUMENTS

CN    102904314 A    1/2013
JP    H1155778 A     2/1999
JP    3183178 U      5/2013
KR    101187262 B1   10/2012

* cited by examiner

*Primary Examiner* — Anthony Haughton
*Assistant Examiner* — Ingrid Wright
(74) *Attorney, Agent, or Firm* — ScienBiziP, P.C.

(57) ABSTRACT

A protection case for protecting an electronic device includes a cover body shaped to receive and hold to the electronic device. A cable winding apparatus is arranged adjacent the cover body and includes a wheel rotatably arranged adjacent the cover body, and a pivot protruding from a center of the wheel and configured to wind a cable of an earphone. A through hole is arranged on a side wall of the pivot and configured to permit a first end of the earphone, which connects to a jack, to pass through.

7 Claims, 5 Drawing Sheets

PROTECTION CASE FOR ELECTRONIC DEVICE

FIELD

The present disclosure relates to accessories of electronic device, specifically to a protection case for an electronic device.

BACKGROUND

The development of electronic devices has dramatically increased over the past decade, resulting in many new genres of battery-powered products such as so-called "smart phones," or electronic readers. All such devices are relatively lightweight and portable, owing to the miniaturization of electronic components and circuitry.

BRIEF DESCRIPTION OF THE DRAWINGS

Implementations of the present technology will now be described, by way of example only, with reference to the attached figures.

DETAILED DESCRIPTION

Figure 1:
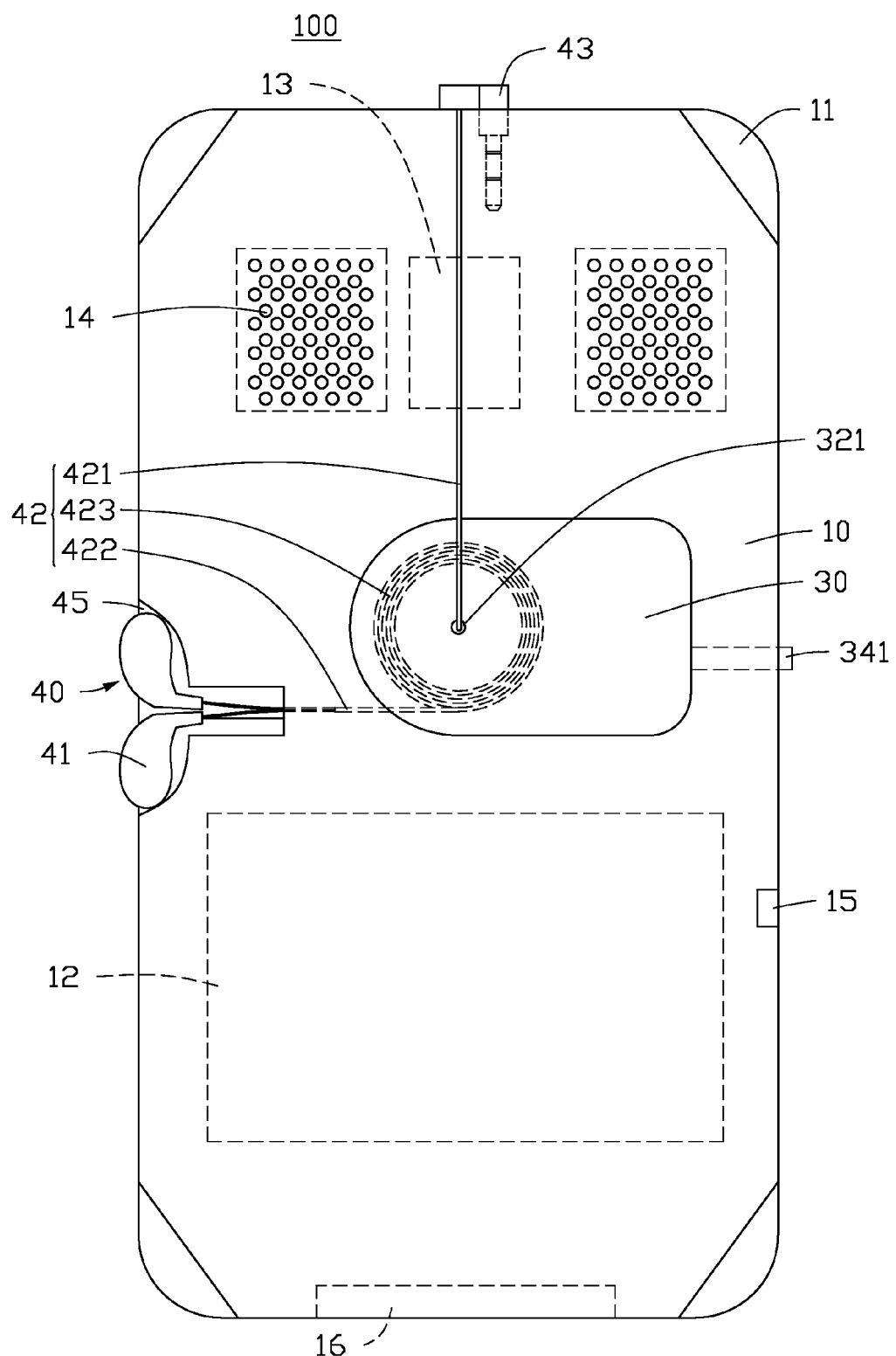
FIG. 1 is a diagrammatic view of a protection case in accordance with an exemplary embodiment.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising," when utilized, means "including, but not necessarily limited to"; it specifically indicates open-ended inclusion or membership in the so-described combination, group, series and the like.

The present disclosure is described in relation to a protection case for an electronic device including a cover body configured to receive and contain the electronic device. A cable winding apparatus is arranged adjacent the cover body and includes a wheel rotatably arranged adjacent the cover body, and a pivot protruding from a center of the wheel and configured to wind a cable of an earphone. A through hole is arranged on a side wall of the pivot, and is configured to permit a first end of the earphone which connects to a jack to pass through.

Figure 2:
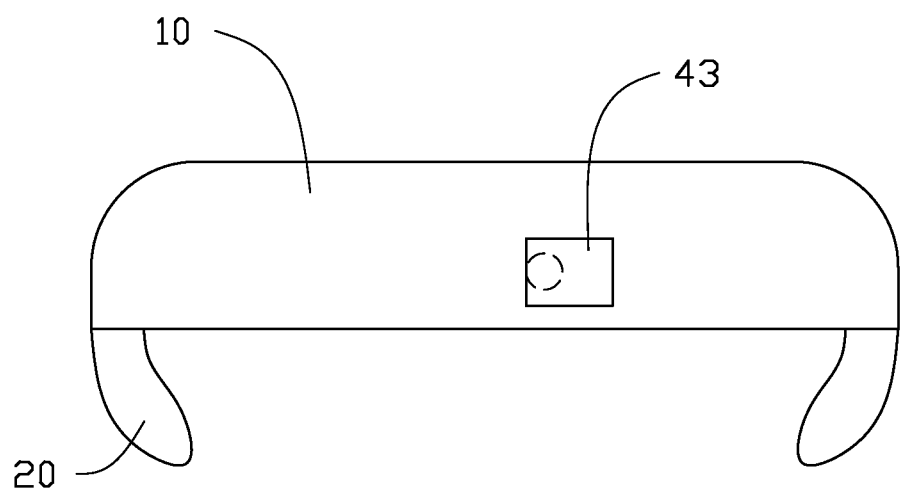
FIG. 2 is a top plan view of the protection case shown in FIG. 1.

FIGS. 1 and 2 illustrate a protection case 100 for an electronic device. The protection case 100 includes a cover body 10 and a plurality of side walls 20. The cover body 10 is shaped to receive and contain the electronic device. The electronic device can be held in the space formed between the cover body 10 and the side walls 20. The protection case 100 further includes a shock absorbing portion 11. In this embodiment, the cover body 10 is substantially rectangular in shape, and four shock absorbing portions 11 are arranged on each of the corners of the cover body 10 respectively. The shock absorbing portions 11 can be made of a shock absorbing material or an elastic material, such as rubber or gel.

Figure 3:
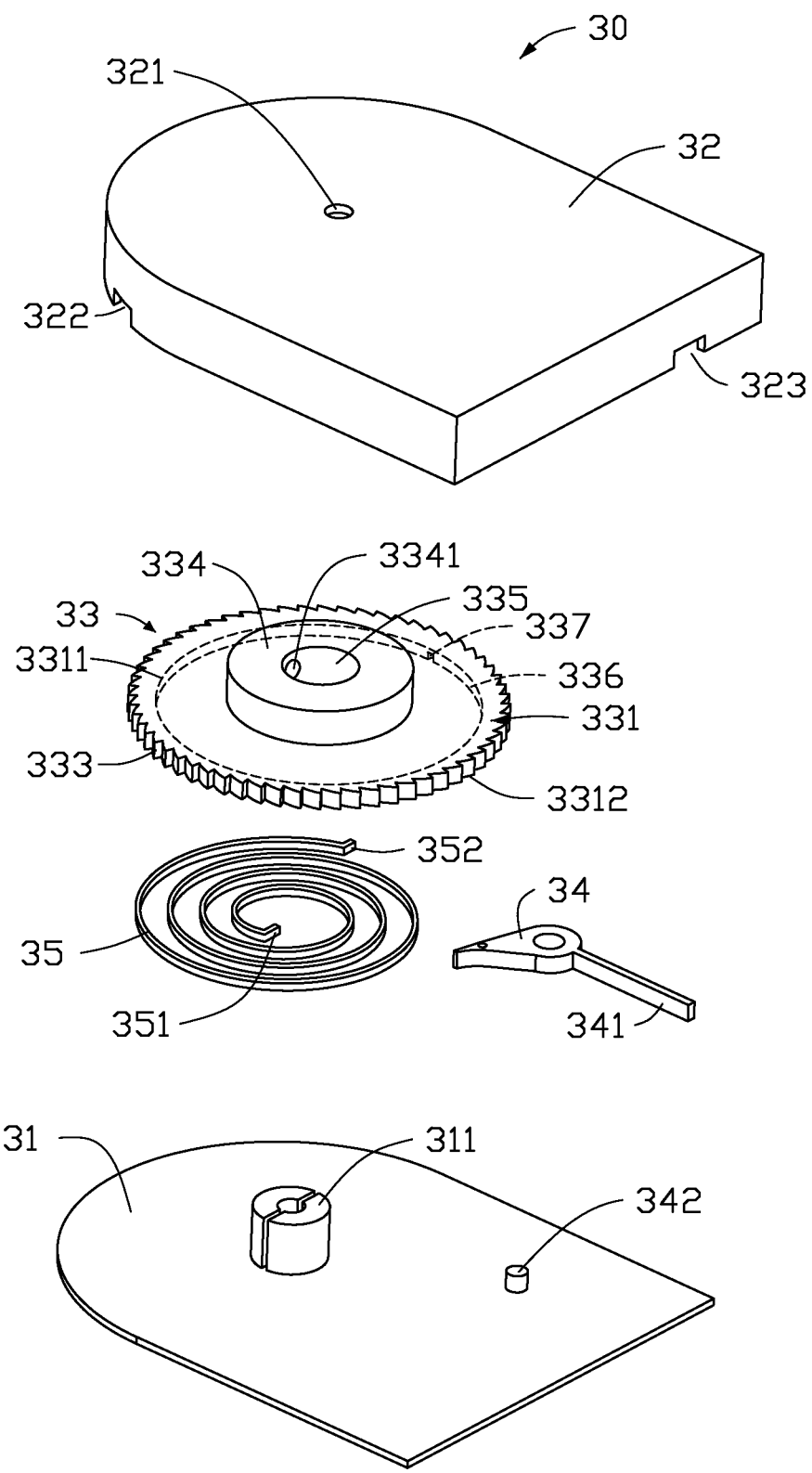
FIG. 3 is an exploded, isometric view of a cable winding apparatus of the protection case shown in FIG. 1, according to an exemplary embodiment.

FIGS. 1 and 3 illustrate that the protection case 100 further includes a cable winding apparatus 30 configured to wind a cable 42 of an earphone 40. The earphone 40 includes the cable 42, two ear buds 41, and a jack 43. The cable 42 includes a cable body 423, a first end 421, and a second end 422 opposite to the first end 421. The first end 421 connects to the jack 43. The second end 422 is connected to the ear buds 41.

The cable winding apparatus 30 includes an base panel 31, a cover 32, a wheel 33, a pawl 34 coupled to the wheel 33, and a coiling spring 35. The wheel 33, the pawl 34, and the coiling spring 35 are accommodated between the cover 32 and the base panel 31. The cable body 423 is partially wound and accommodated in the cable winding apparatus 30. The first end 421 and the second end 422 of the cable 42 respectively pass through the cover 32 and extend out of the cable winding apparatus 30. The cover body 10 of the protection case 100 includes a receiving hole 45 configured to receive ear buds 41, and an earphone aperture (not shown) configured to receive the jack 43.

The base panel 31 includes a cylinder 311 protruding from a surface of the base panel 31. The wheel 33 includes a wheel body 331 and a pivot 334 protruding from a center of a first surface 3311 of the wheel body 331. An axle hole 335 is defined on the center of the pivot 334 and axially passes through the wheel body 331 and the pivot 334. The wheel body 331 is coaxial with the pivot 334. The axle hole 335 is coupled to the cylinder 311, and the cylinder 311 is received in the axle hole 335. With such a configuration, the wheel 33 can rotate round the cylinder 311. A through hole 3341 is arranged on a side wall of the hollow pivot 334. A recess 336 is defined on a second surface 3312 of the wheel body 331 to receive the coil spring 35. An opening 337 is arranged on a side wall of the recess 336. A third end 351 of the coil spring 35 is fixed on the cylinder 311, and a fourth end 352 of the coil spring 35 is fixed in the opening 337. In other embodiments, one end of the coil spring 35 is fixed on the cylinder 311, and another end of the coil spring 35 is fixed to the second surface 3312 of the wheel body 331.

In the embodiment, the wheel 33 further includes a number of ratchets 333 on the circumference of the wheel body 331. The pawl 34 includes a rod 341 with a free end extending out of the cover 32 via a third through opening 323. The pawl 34 is rotatably connected to the base panel 31. In the embodiment, the pawl 34 is rotatably connected to the base panel 3 via the pivot 342. The pawl 34 is transitionable between a locked configuration in which the pawl 34 is latching with the ratchet 333 of the wheel 33, and a released configuration in which the pawl 34 is separated from the wheel 33.

The cover 32 includes a first through opening 321 and a second through opening 322. The cable body 423 is partially wound around the pivot 334 and accommodated in the cable winding apparatus 30. The second end 422 of the cable body 423 which connects to the ear buds 41 passes through the second through opening 322 to extend out of the cable winding apparatus 30. The first end 421 which connects to the jack 43 passes through the through hole 3341 of the wheel 33 and passes through the first through opening 321 to extend out of the cable winding apparatus 30.

If a user pulls on the ear buds 41, the wheel 33 rotates around the cylinder 311 in a first rotation direction, thus releasing the cable body 423. When the wheel 33 is rotating, the pawl 34 is in the released configuration and the coil spring 35 is stretched. If the user removes the force applied on the ear buds 41, the wheel 33 stops rotating and the pawl 34 changes to the locked configuration in which the pawl 34 is latching with the ratchet 333 of the wheel 33. The pawl 34 can be switched between the locked configuration and the released configuration by pushing the rod 341 of the pawl 34. When the cable 42 needs to be wound on the wheel 33 again, the user can push the rod 341 to switch the pawl 34 to the released configuration, the wheel 33 rotates under restoring force of the stretched coil spring 35, in a second rotation direction opposite to the first rotation direction.

In this embodiment, only one example of the cable winding apparatus 30 is explained. In other embodiments, any other cable winding apparatus can be used to automatically retract the cable 42 of the earphone 40.

Figure 4:
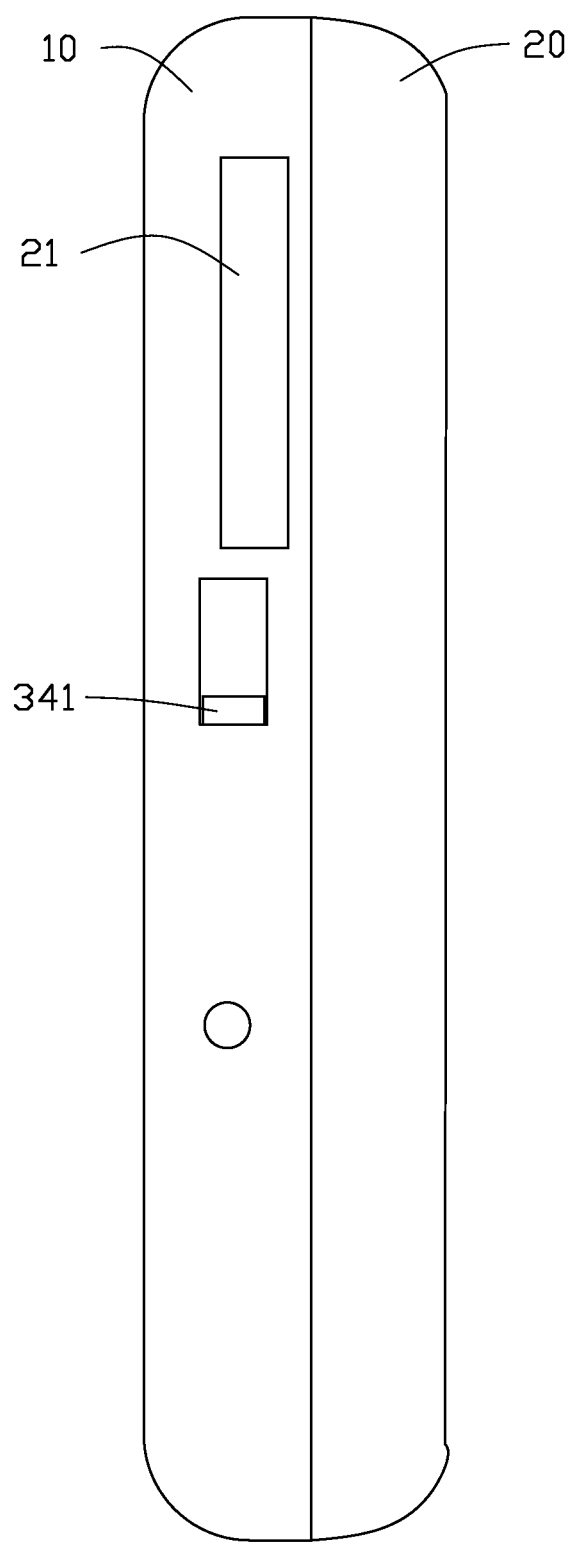
FIG. 4 is a right-side elevational view of the protection case shown in FIG. 1.

FIGS. 1 and 4 illustrate at least one aperture 21 defined on the side wall 20 of the protection case 100. The aperture 21 is coupled to buttons (not shown) of the electronic device.

Figure 5:
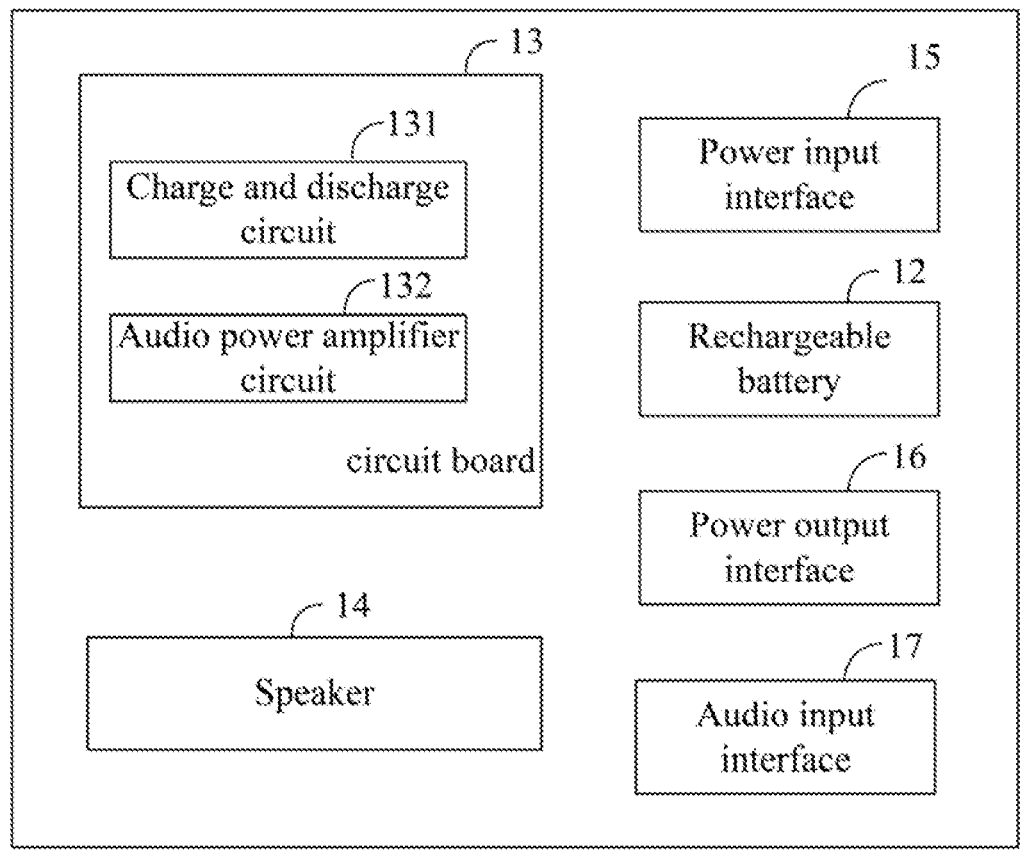
FIG. 5 is a block diagram of the protection case shown in FIG. 1, according to an exemplary embodiment.

FIGS. 1 and 5 illustrate that the protection case 100 further includes a rechargeable battery 12, a circuit board 13 and a speaker 14 respectively accommodated in the cover body 10, a power input interface 15 and a power output interface 16. The circuit board 13 includes a charge and discharge circuit 131, and an audio power amplifier circuit 132.

The rechargeable battery 12 applies power to the circuit board 13 and the speaker 14. The rechargeable battery 12 also serves as an external power supply of the electronic device. The charge and discharge circuit 131 connects to the power input interface 15, the power output interface 16, and the rechargeable battery 12, and is configured to manage the charging and discharging of the rechargeable battery 12.

The audio power amplifier circuit 132 connects to the speaker 14, and is configured to amplify audio signal and transmit the amplified audio signal to the speaker 14. In at least one embodiment, the protection case 100 further includes an audio input interface 17 connected to the audio power amplifier circuit 132, the audio input interface can connect to an earphone jack of the electronic device via a audio cable, and receive audio signals from the electronic device.

The embodiments shown and described above are only examples. Many details are often found in the art such as the other features of a protection case. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size and arrangement of the parts within the principles of the present disclosure up to, and including the full extent established by the broad general meaning of the terms used in the claims. It will therefore be appreciated that the embodiments described above may be modified within the scope of the claims.

What is claimed is:

1. A protection case for protecting an electronic device comprising:
   a cover body shaped to accept and removably couple to the electronic device; and
   a cable winding apparatus adjacent the cover body, and comprising:
      a base panel comprising a cylinder protruding from the base panel;
         a wheel rotatably arranged adjacent the cover body;
            wherein the wheel comprises:
            a wheel body;
         a pivot protruding from a center of a first surface of the wheel body to wind a cable of an earphone;
         a through hole arranged on a side wall of the pivot to permit a first end of the cable which connects to a jack to pass through;
         a number of ratchets defined at a circumference surface of the wheel body;
      an axle hole, which is defined on a center of the pivot, coupled to the cylinder and axially passing through the wheel body and the pivot;
      a coil spring having an first end fixed to the cylinder, and having a second end fixed to a second surface of the wheel body; and
      a pawl coupled to the wheel body and rotatably connected to the base panel, the pawl transitionable between a locked configuration in which the pawl is latched with the ratchet of the wheel body, and a released configuration in which the pawl is separated from the ratchet of the wheel body, wherein the pawl comprises a rod having a free end extending out of the protection case, the rod switches the pawl between the locked configuration and the released configuration in response to an operation.

2. The protection case of claim 1, wherein the cable winding apparatus comprises:
   a cover comprising a first through opening to permit the first end of the earphone to pass through and extend out of the cable winding apparatus, and a second through opening configured to permit a second end of the earphone which connects to ear buds to pass through and extend out of the cable winding apparatus;
   wherein the wheel, the pawl and the coil spring are accommodated between the cover and the base panel.

3. The protection case of claim 1, further comprising a speaker.

4. The protection case of claim 1, further comprising a circuit board and an audio input interface, wherein the circuit board comprises an audio power amplifier circuit connected to the speaker and the audio input interface.

5. The protection case of claim 1, further comprising a circuit board, a rechargeable battery, a power input interface and a power output interface, wherein the circuit board comprises a charge and discharge circuit connected to the power input interface, the power output interface and the rechargeable battery.

6. The protection case of claim 1, further comprising one or more shock absorbing portions arranged on a corner of the cover body.

7. The protection case of claim 1, further comprising an aperture defined on the side wall of the protection case coupled to a button of the electronic device.

* * * * *